(12) United States Patent
Cunningham

(10) Patent No.: US 6,919,261 B2
(45) Date of Patent: Jul. 19, 2005

(54) METHOD AND RESULTING STRUCTURE FOR MANUFACTURING SEMICONDUCTOR SUBSTRATES

(75) Inventor: Shaun Joseph Cunningham, New South Wales (AU)

(73) Assignee: Epitactix PTY LTD, Marsfield (AU)

( * ) Notice: Subject to any disclaimer, the term of this patent is extended or adjusted under 35 U.S.C. 154(b) by 0 days.

(21) Appl. No.: 10/389,278

(22) Filed: Mar. 13, 2003

(65) Prior Publication Data

US 2004/0007763 A1 Jan. 15, 2004

(30) Foreign Application Priority Data

Mar. 14, 2002 (AU) ................................. PS1122

(51) Int. Cl.$^7$ ............................................ H01L 21/00
(52) U.S. Cl. ...................... 438/455; 438/458; 438/459; 257/619; 257/620; 257/621
(58) Field of Search ................................. 438/455, 458, 438/459; 257/619–621

(56) References Cited

U.S. PATENT DOCUMENTS

| | | |
|---|---|---|
| 3,689,993 A | 9/1972 | Tolar |
| 3,755,026 A | 8/1973 | Reynolds |
| 3,864,819 A | 2/1975 | Ying |
| 3,903,592 A | 9/1975 | Heckl |
| 3,913,215 A | 10/1975 | Heckl |
| 3,973,320 A | 8/1976 | Greco et al. |
| 3,986,251 A | 10/1976 | Altemus et al. |
| 4,297,717 A | 10/1981 | Li |
| 4,811,079 A | 3/1989 | Turina et al. |
| 4,856,702 A | 8/1989 | Kloucek |
| 5,198,695 A | 3/1993 | Hanes et al. |
| 5,292,685 A | 3/1994 | Riley et al. |
| 5,346,848 A | 9/1994 | Grupen-Shemansky et al. |
| 5,389,803 A | 2/1995 | Mohammad |
| 5,399,512 A | 3/1995 | Mohammad et al. |
| 5,536,361 A | 7/1996 | Kondo et al. |
| 5,825,090 A | 10/1998 | Piccone |
| 5,985,739 A | 11/1999 | Plettner et al. |
| 6,093,577 A | 7/2000 | Groen et al. |
| 6,211,562 B1 | 4/2001 | Forbes et al. |
| 6,248,646 B1 | 6/2001 | Okojie |
| 6,319,778 B1 | 11/2001 | Chen et al. |
| 6,468,824 B2 * | 10/2002 | Chen et al. ............... 438/46 |
| 6,555,405 B2 | 4/2003 | Chen et al. |
| 2002/0010389 A1 | 1/2002 | Forbes et al. |
| 2002/0137243 A1 | 9/2002 | Chen et al. |
| 2002/0137244 A1 | 9/2002 | Chen et al. |
| 2003/0178637 A1 | 9/2003 | Chen et al. |

FOREIGN PATENT DOCUMENTS

| | | |
|---|---|---|
| JP | 60-116749 | 6/1985 |
| JP | 60-144932 | 7/1985 |
| JP | 03-156935 | 7/1991 |
| WO | WO 2003/077311 A1 | 9/2003 |

OTHER PUBLICATIONS

Derwent Abstract Accession No. 85–187602/31, JP60–116749 A (Sumitomo Elec Ind. KK), Jun. 24 195.
Derwent Abstract Accession No. 85–187602/31, JP60–116749 A (Sumitomo Elec Ind. KK), Jun. 24 195.

* cited by examiner

*Primary Examiner*—Donghee Kang
(74) *Attorney, Agent, or Firm*—Townsend and Townsend and Crew LLP

(57) ABSTRACT

A semiconductor wafer composite is used as a basis for fabricating semiconductor chips, especially compound semiconductor devices. The semiconductor wafer composite advantageously comprises a metallic substrate 210 and multiple semiconductor tiles 220 bonded to the surface of the metallic substrate 210. The semiconductor wafer composite is effectively used as a single large semiconductor wafer for volume fabrication, and can be used to fabricate semiconductor devices in a similar manner.

23 Claims, 3 Drawing Sheets

METHOD AND RESULTING STRUCTURE FOR MANUFACTURING SEMICONDUCTOR SUBSTRATES

CROSS-REFERENCES TO RELATED APPLICATIONS

This application claims priority to Australian Provisional Patent Application No. PS1122 filed Mar. 14, 2002, commonly assigned, and hereby incorporated by references for all purposes.

STATEMENT AS TO RIGHTS TO INVENTIONS MADE UNDER FEDERALLY SPONSORED RESEARCH OR DEVELOPMENT

BACKGROUND OF THE INVENTION

The present invention relates generally to manufacturing substrates. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But it would be recognized that the invention has a much broader range of applicability.

As technology progresses, semiconductor manufacturers have continually strived to use ever larger wafers to obtain economies of scale, and consequently lower the cost of individual semiconductor devices. Commonly, silicon crystal boules can be readily grown large enough to slice into 12 inch diameter wafers. The 12 inch wafers have been produced for single crystal silicon materials for a variety of applications. Although the single crystal silicon has many benefits, there are still numerous disadvantages.

Many conventional industries have been increasingly reliant on compound semiconductor devices fabricated from compound semiconductors such as gallium arsenide, indium phosphide, and gallium nitride. Unfortunately, integrated circuits made from these semiconducting compounds are still relatively expensive compared to circuits made from silicon semiconductors. This cost difference is largely attributable to the respective material costs, and wafer processing costs. Other limitations also exist with compound semiconductor materials.

Compound semiconductor wafers are more prone to damage. For example, they are more brittle than conventional single crystal silicon wafers. Growing large crystal boules of compound semiconductor material is extremely difficult compared with growing large single crystal silicon boules. The maximum diameters for commercially-produced compound semiconductor wafers of gallium arsenide, indium phosphide and gallium nitride are respectively six inches, four inches and two inches in conventional commercial applications.

Larger compound semiconductor wafers would be desirable. Unfortunately, larger diameter wafers are difficult to make efficiently. Even if larger boules of compound semiconductor material could be produced, handling the resulting large-diameter compound semiconductor wafers would generally be problematic. Compound semiconductor wafers of the desired thickness and diameter would be extremely fragile and prone to breakage. Here, the larger wafers would generally break due to the brittle nature of these semiconductor compounds. Accordingly, certain techniques have been proposed to manufacture larger compound semiconductor wafers using an epitaxial grown layer.

As merely an example, a conventional process for fabricating compound semiconductor chips could be outlined in steps (i) to (vii) listed below.

(i) Grow epitaxial device layers on mono-crystalline substrate.

(ii) Pattern these epitaxial layers and other deposited dielectric and metallic layers using photolithographic techniques.

(iii) Bond wafers face-down to a temporary supporting substrate after front-side process is complete.

(iv) Thin wafers by mechanical grinding or lapping back-side.

(v) Create "via holes" in the substrate, which provide a means for connecting the back-side ground to appropriate front-side ground connections.

(vi) Deposit a metal film on the wafer's back-side to provide a ground plane, and coat the walls of the via holes, thereby making contact with the front-side ground connections.

(vii) Dice wafer into individual chips.

In the above conventional process, wafers are typically 625 $\mu$m in thickness during steps (i), (ii) and (iii), and have sufficient mechanical strength to avoid breakage with careful handling. Wafers are typically thinned to around 50 to 100 $\mu$m in thickness in step (iv). Thinning wafers has numerous advantages, which relate to:

(i) reducing the depth (and also the size) of via holes, as well as parasitic inductance associated with the via holes;

(ii) conducting heat away from front-side devices towards the back-side, which is normally attached to a heat sink; and (iii) preventing electromagnetic resonance in the substrate at high frequencies.

Handling thinned compound semiconductor wafers is often difficult, and compound semiconductor wafers are commonly broken from step (iv) onwards. Breakage is costly, since most of the processing (steps (i) to (iii)) is already complete. The fragility of compound semiconductor materials also causes breakages of resulting chip devices, and restricts the larger size of practical chip designs that use compound semiconductor materials. Here, larger sized compound semiconductor materials are not practical to make efficiently.

In view of the above, a need exists for improved techniques for producing and handling semiconductor wafers. In particular, a need exists for techniques suitable for assisting practical and cost-effective production of compound semiconductor devices.

BRIEF SUMMARY OF THE INVENTION

According to the present invention, techniques for manufacturing substrates are provided. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But, it would be recognized that the invention has a much broader range of applicability.

Described herein are techniques for producing a semiconductor wafer composite from which semiconductor chips can be fabricated. The semiconductor wafer composite comprises a metallic substrate and one or more semiconductor "tiles" bonded to the surface of the metallic substrate. These semiconductor tiles are formed by cutting a semiconductor wafer to a desired shape, as later described. The described techniques find particular application in fabricating compound semiconductor devices, but are also more broadly applicable to all types of semiconductor wafers.

Multiple wafer tiles are advantageously bonded to the metallic substrate before any front-side processing. The metallic substrate desirably remains attached to the semiconductor material when the composite is divided into individual chips. The semiconductor wafer composite is effectively used as a single large semiconductor wafer, and can be used to fabricate semiconductor devices in a similar manner. By way of the metal substrate, the composite is more durable and efficient.

The semiconductor tiles are advantageously square or rectangular, or one or more other shapes able to be conveniently tessellated on the metallic substrate to efficiently cover the surface of the metallic substrate. These shapes are conventionally cut from the standard "clipped-circular" wafer shape.

In a specific embodiment, the invention provides a packaged compound semiconductor integrated circuit device. The packaged device includes a compound semiconductor substrate comprising a backside surface. The device has a metal substrate bonded to the backside surface. The metal substrate provides mechanical support for the compound semiconductor substrate before being packaged. The metal support allows the compound semiconductor to be handled. The compound semiconductor has a predetermined size that is larger than a size that would be damaged if it was free from the metal support according to preferred embodiments. Here, the large size would be too large for efficient handling without the support structure. A support substrate is coupled to the metal substrate for packaging.

In a further alternative embodiment, the invention provides a bonded semiconductor wafer composite for fabricating semiconductor devices. The bonded semiconductor wafer has a metal support substrate. The metal substrate has a first diameter and an upper surface, which is substantially planar. The metal support structure is characterized by a first coefficient of thermal expansion parameter. The wafer also has a plurality of trapezoidal shaped tiles comprising a compound semiconductor material. The plurality of trapezoidal shaped tiles are bonded onto the upper surface of the metal support substrate. Each of the trapezoidal shaped tiles includes at least one edge, which is aligned with an edge of a different trapezoidal shaped tile. Each of the plurality of trapezoidal shaped tiles is characterized by a second coefficient of thermal expansion parameter. A eutectic bonding material is coupled between each of the trapezoidal shaped tiles and a portion of the upper surface of the metal support substrate. The eutectic bonding material provides a continuous mechanical and electrical contact between the portion of the upper surface and the trapezoidal shaped tile. The first coefficient of thermal expansion parameter is within a predetermined amount of the second coefficient of thermal expansion parameter. The predetermined amount is selected to reduce a possibility of breakage of any portion of any trapezoidal shaped tile bonded to the portion of the upper surface of the metal substrate from a thermal influence, e.g., contraction, expansion. Each of the trapezoidal shaped tiles is derived from a compound semiconductor substrate of a second diameter, which is less than the first diameter associated with the metal substrate. Each of the trapezoidal shaped tiles comprises a predetermined thickness.

Various advantages can be achieved through use of a semiconductor tile bonded to a metallic substrate. The semiconductor wafer composite is less fragile than the semiconductor tile, and can thus be handled in larger areas. As a result, cost savings can be achieved through larger volume fabrication.

In particular, compound semiconductor wafers that have been hitherto produced from smaller diameter wafers can be processed in any effective size through the use of multiple semiconductor tiles. Consequently, existing fabrication equipment for treating 12 inch diameter silicon wafers can be used to fabricate compound semiconductor devices using the described semiconductor wafer composite.

DETAILED DESCRIPTION OF THE INVENTION

According to the present invention, techniques for manufacturing substrates are provided. More particularly, the invention provides a method and device for improved semiconductor substrates to form advanced semiconductor devices. Merely by way of example, the invention has been applied to a metallic substrate that includes a plurality of panels and/or tiles, which are bonded on the substrate, for the manufacture of the advanced semiconductor devices. But it would be recognized that the invention has a much broader range of applicability.

A semiconductor wafer composite is described herein. The composite is well suited to fabrication of compound semiconductor devices. Further, the composite has particular application in the context of large scale production of such devices. The semiconductor wafer composite from which the individual semiconductor devices are fabricated is first described, followed by a procedure for high volume production of semiconductor devices using the described semiconductor wafer composite.

Figure 1:
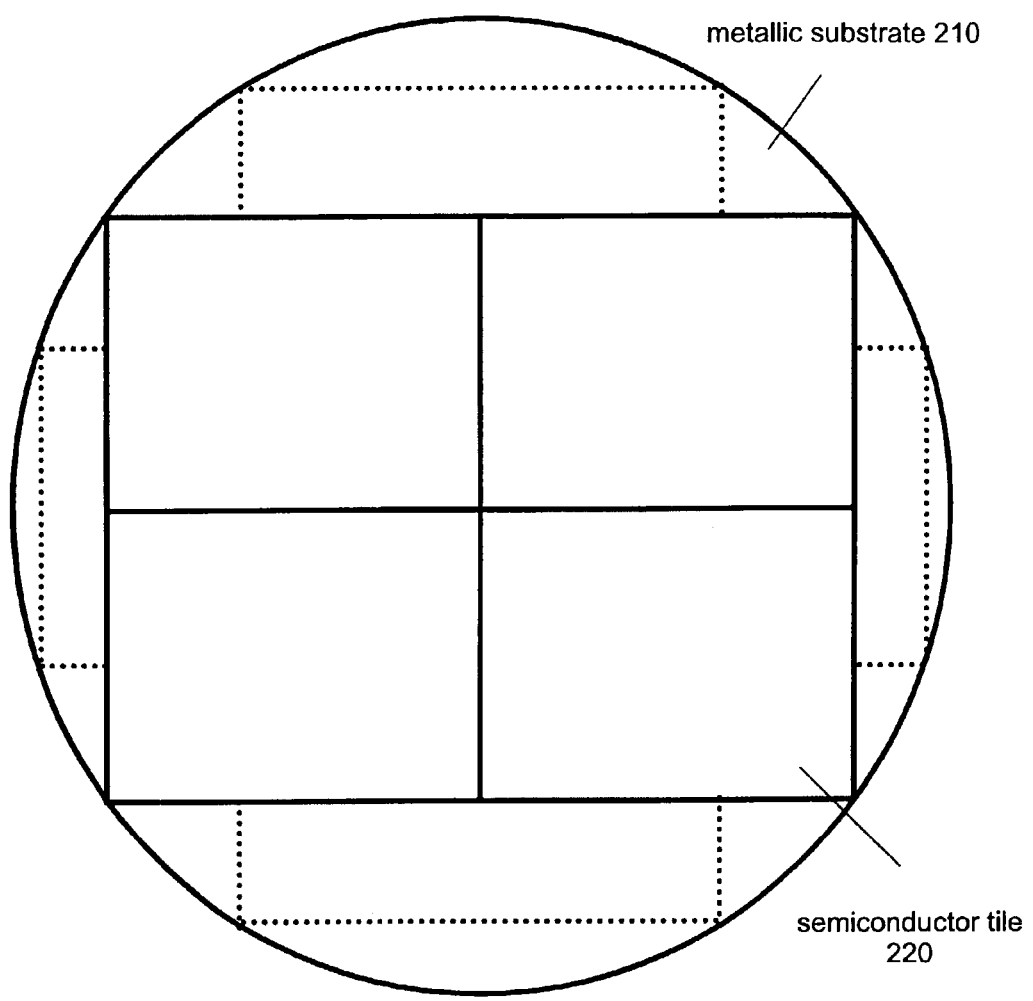
FIG. 1 is a simplified schematic representation of a view, from above, of a semiconductor wafer composite comprising a circular metallic substrate on which four square semiconductor tiles are bonded according to an embodiment of the present invention.
Figure 2:
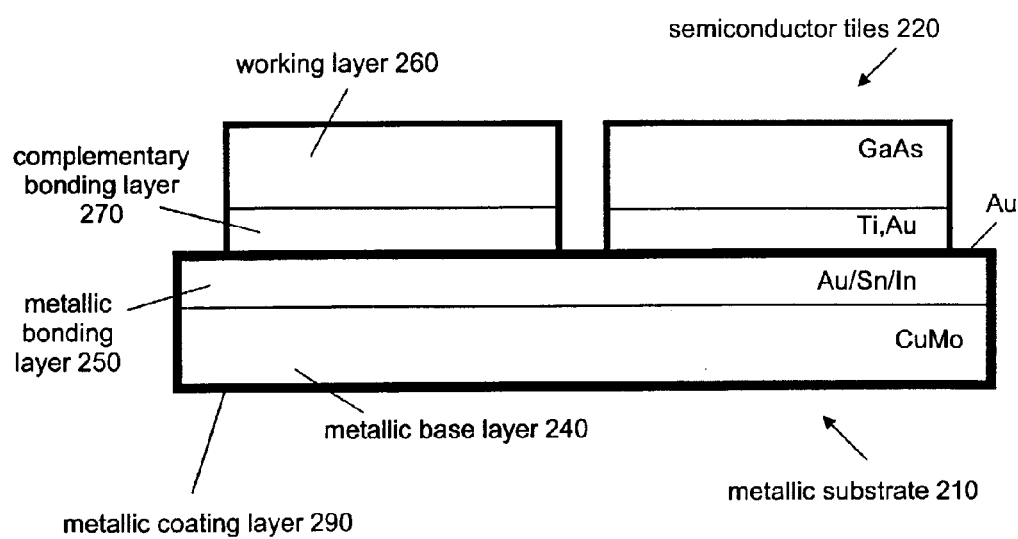
FIG. 2 is a simplified cross-sectional view corresponding with FIG. 1.

FIGS. 1 and 2 schematically represent a simplified semiconductor wafer composite, using top and side views respectively according to an embodiment of the present invention. This diagram is merely an example, which should not unduly limit the scope of the claims herein. One of ordinary skill in the art would recognize many variations, modifications, and alternatives. The semiconductor wafer composite effectively replaces existing semiconductor wafers from which semiconductor chip devices are fabricated.

The described semiconductor wafer composite represented in FIGS. 1 and 2 comprises a metallic substrate 210 upon which is bonded a number of semiconductor tiles 220.

FIG. 1 represents the metallic substrate 210 as circular in shape, and represents four abutting rectangular semiconductor tiles 220. The four rectangular shapes shown in dotted outline represent further rectangular semiconductor tiles 220 that may be bonded to the metallic substrate 210 near the periphery of the metallic substrate 210, to more efficiently use the surface of the metallic substrate 210. The substrate is preferably made from materials which have good electrical and thermal conductivity and whose coefficient of thermal expansion matches that of the semiconductor tiles. For example, CuMo, AlSi and Mo are suitable materials. Preferably, the substrate is highly conductive with resistivity in the range 1 to 10 micro ohm centimeters ($1-10\times10^{-6}$ ohm-cm) according to a specific embodiment. Alternatively, the material can be semiconductor according to other embodiments. The tiles 220 are closely placed together, through perhaps not directly abutting. A slight spacing between wafer tiles 220 eases tile dimension accuracy requirements and allows for slight thermal expansion gaps, if desirable. Indicative gap dimensions may be, for example, less than 5 $\mu$m. Preferably, each of the tiles should have a slight gap to separate them from each other to account for any differences in tolerances. Alternatively, the tiles are abutting each other to prevent or reduce impurities (e.g., photoresist) from entering regions between the tiles according to other embodiments.

FIG. 2 is a side view that corresponds with FIG. 1. The peripheral semiconductor tiles 220 depicted in dotted outline in FIG. 1 are not represented in FIG. 2. The metallic substrate 210 comprises a metallic base layer 240, upon which is formed a metallic bonding layer 250. The metallic base layer 240 may be formed of a suitable metal or alloys that matches the coefficient of thermal expansion (CTE) of the compound semiconductor material. For a gallium arsenide (GaAs) compound semiconductor tile 220, a suitable choice of metallic substrate 210 is copper molybdenum (CuMo). The metallic bonding layer 250 is desirably formed of tin (Sn) or indium (In) and gold (Au), or other suitable metals having a relatively low melting point, and which form a eutectic alloy upon heating. In preferred embodiments, the eutectic alloy is provided purely from compression and free from relative lateral movement between the tile and substrate.

The semiconductor tiles 220 comprise a working layer 260 of compound semiconductor material (such as gallium arsenide (GaAs)), and a complementary bonding layer 270 preferably formed of a material that assists the semiconductor tile 220 to adhere to the metallic substrate 210. A suitable material is a combination of titanium (Ti) and gold (Au).

Surrounding the metallic base layer 240 and metallic bonding layer 250 is a thin metallic coating layer 290, formed of a noble metal. Gold (Au) or platinum (Pt) is preferably used. The coating layer 290 seals the metallic substrate 210 from damage during subsequent fabrication of semiconductor devices from the semiconductor wafer composite. The coating layer 290 can be applied by evaporation/deposition techniques, or by electroplating, for example.

While components of the semiconductor wafer composite are described above with reference to FIGS. 1 and 2, various other associated features and advantages of the semiconductor wafer composite are described below with reference to a process for manufacturing the semiconductor wafer composite. This manufacturing process is described herein with reference to steps 310 to 330 of FIG. 3. Remaining steps 340 to 370 of FIG. 3 describe subsequent steps in fabricating semiconductor devices from the semiconductor wafer composite.

In a specific embodiment, each of the tiles has a specific size and shape. The metal substrate also has a desired shape and size. That is, the metal substrate has a diameter "dm", which is chosen according to the capabilities of the intended wafer processing equipment. This dimension is preferably selected from a set of industry diameters, e.g., 2 inch, 3 inch, 4 inch, 5 inch, 6 inch, 8 inch, 12 inch. The substrate is shaped to provide a "flat" on one part of the circumference that acts as an alignment reference, which is similar to conventional wafers.

Further, the substrate may be patterned to provide apertures which aid packaging operations or which facilitate the coupling of signals off chip. For example, the apertures may be used to form slots which radiate high frequency signals off chip.

The tiles would be cut from circular compound semiconductor wafers of radius "ds" where an integral number of wafer diameters "ds" equate to the metal substrate diameter "dm" ie dm=n×ds where n is the smallest possible integer. This relationship ensures the least number of tiles and minimum wastage of expensive compound semiconductor material in cutting tiles to the appropriate shape. For example, four square tiles with 3 inch diagonal dimensions could be cut from 3 inch semiconductor wafers to cover a six inch metallic substrate in a 2×2 tile array. If only 2 inch diameter semiconductor wafers were available, nine square tiles with 2 inch diagonals could be prepared to cover a six inch substrate in a 3×3 array. Of course, there would be various modifications, alternatives, and variations.

Although the semiconductor wafer described above is illustrated using a specific embodiment, there can be many variations, alternatives, and modifications. For example, the metal substrate can be made of an alloy or other material, as well as other multilayered materials and the like, which have desirable electrical and thermal characteristics. The metal substrate can also be multi-layered, depending upon the application. Additionally, one or more of the tiles can be made of a different material on the substrate. These and other variations can be found throughout the present specification and more particularly below.

Figure 3:
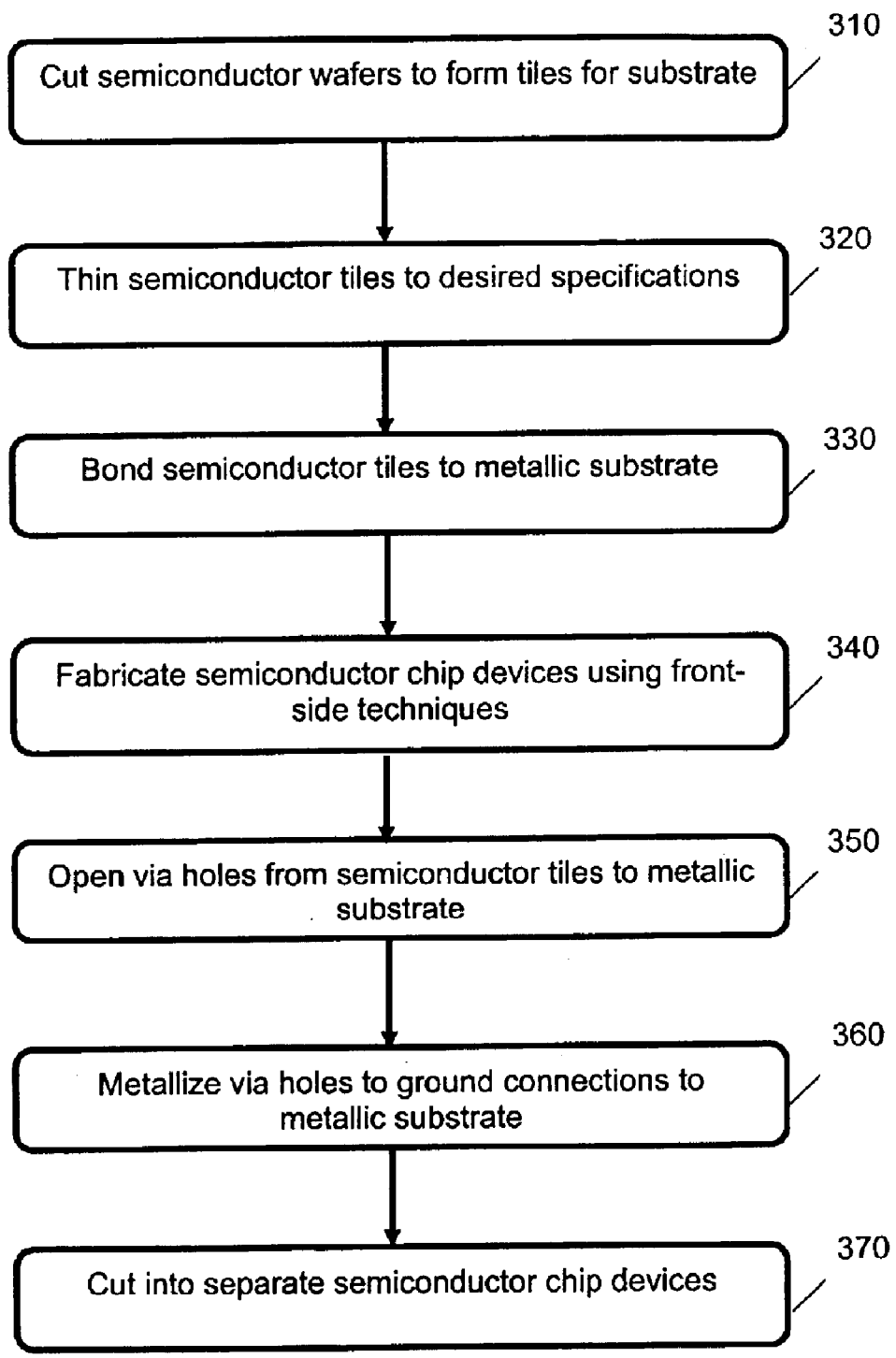
FIG. 3 is a simplified flowchart of a method involved in fabricating semiconductor chips from the semiconductor wafer composite of FIGS. 1 and 2 according to an embodiment of the present invention

In a specific embodiment, a method for fabricating compound semiconductor devices involves, in overview, the steps listed below in Table 1. FIG. 3 flowcharts these steps, which are described in further detail below.

TABLE 1

| | |
|---|---|
| Step 310 | Multiple semiconductor wafers are thinned 220. |
| Step 320 | The wafers 220 are cut to form semiconductor tiles. |
| Step 330 | The semiconductor tiles 220 are bonded to the metallic substrate 210. |
| Step 340 | Standard front-side processing techniques are used to fabricate devices. |
| Step 350 | Via holes are opened from the front-side to the metallic substrate 210. |
| Step 360 | Via holes are metalized to make ground connections to the metallic substrate 210. |
| Step 370 | The metallic substrate 210 is cut to separate individual chips. |

As shown above, the above steps are merely illustrative. Depending upon the embodiment, certain steps can be further separated or even combined with other steps. Additional steps can be added depending upon the embodiment. Other steps can replace certain steps above. Accordingly, there can be many variations, modifications, and alternatives. Further details of each the steps can be found throughout the present specification and more particularly below.

Thinning Semiconductor Tiles—Step 310

Individual wafer tiles 220 are thinned according to existing processing techniques. If the wafers break at this point, the associated cost is relatively low since the front side of the semiconductor tile 220 has not been processed. According to a specific embodiment, tiles are thinned using a lapping/grinding and/or polishing operation. The tiles can be thinned to a thickness of about 50 to 100 microns according to certain embodiments. According to a specific embodiment, tiles are thinned using a lapping/grinding and/or polishing operation.

Forming Semiconductor Tiles—Step 320

Semiconductor wafers are cut to form semiconductor tiles 220. Preferably, each of the tiles is provided using a scribing and breaking process. More preferably, scribing can be provided via a diamond stylus, laser cutting, or the like. These are preferably "standard" wafers that have epitaxial layers grown on their front side and are ready for device fabrication. The semiconductor tiles 220 are shaped such that these semiconductor tiles 220 can cover a planar surface with minimal intervening gaps. According to a specific embodiment, each of the tiles is formed along a crystalline plane, which provides an accurate shape and form. Such accurate shape and form allows for alignment between each of the tiles to reduce a possibility of gaps between each of the tiles. This also subsequently enables all tiles to be arranged on the metallic substrate with the same crystal orientation.

Bonding Tiles to Substrate—Step 330

A metallic substrate material is chosen to match the coefficient of thermal expansion (CTE) of the chosen semiconductor over the required range of processing temperatures. The substrate material is also chosen for its strength, thermal and electrical conductivity and cost. Preferably, the substrate also has a high thermal conductivity to carry away heat from an integrated device formed thereon. According to certain embodiments, the thermal conductivity of the metallic substrate can be 165 Watts/m-Kelvin or greater.

For example, an alloy of approximately 80% molybdenum and 20% copper matches the CTE of gallium arsenide and has suitable electrical and thermal conductivity. An advantage of using a metallic substrate 210 is that the CTE can be adjusted by changing the composition of the metal alloy. No such adjustment is possible if a crystalline substrate such as silicon is used.

The metallic substrate 210 is polished on one face and its perimeter is shaped to suit large diameter wafer processing equipment. Preferably, polishing reduces a possibility of air gaps forming between the surface of the substrate and the tiles. The metallic substrate has a surface roughness no greater than a predetermined amount and a uniformity of less than a certain amount across the substrate in certain embodiments to facilitate the bonding process. According to certain embodiments, the surface can also include a series of patterns and/or textures, which prevent the formation of air bubbles, etc. and enhance the bonding process. This typically means the metallic substrate 210 is circular in shape (as represented in FIGS. 1 and 2). A minor flat on one side can be provided, for compatibility with existing wafer processing equipment.

The metallic substrate 210 is preferably made as thin as possible so as not to increase the weight or heat capacity of the composite structure. A typical thickness might be in the range 200 $\mu$m to 400 $\mu$m.

An inert coating layer 290 is then deposited on the metallic substrate 210 if there is a risk that the substrate 210 might be effected by subsequent semiconductor process chemistry. A thin layer (typically less than 1 $\mu$m in thickness) of a noble metal such as gold or platinum is generally suitable for this purpose. Preferably, the coating is non-reactive with subsequent semiconductor processing steps. Other materials (such as silicon nitride) can also be used, provided such materials have sufficient resistance to process chemistry and temperatures used in the intended wafer processing steps.

The bonding layer 250 is deposited on the polished surface of the metallic substrate 210. This metallic bonding layer 250 is preferably made from two or more metals that form a eutectic alloy on heating. The outermost layer is preferably a noble metal (such as gold) that prevents the underlying layers from oxidising before and during bonding. Underlying layers may be formed of tin or indium. These metals are chosen such that the eutectic alloy forms at relatively low temperature (for example, 200 Degrees Celsius) and having formed, does not melt at the elevated temperatures encountered during wafer processing. The bonding layer may also serve as the inert coating layer for the metallic substrate.

A complementary bonding layer 270 is also deposited on the back-side of each thinned semiconductor wafer tile 220. This complementary bonding layer 270 is also preferably metallic and its composition is chosen to provide maximum adhesion to the semiconductor tile 220 over the range of subsequent processing temperatures. The preferred layer structures are titanium/gold or titanium/platinum/gold, but many other combinations of metals are possible without departing from the scope and spirit of the invention.

Numerous other bonding layer compositions are possible, and may be chosen to match particular processing requirements (such as maximum temperature) of different semiconductor materials.

The use of metallic bonding layers offers the advantage of allowing bonding to occur at relatively low temperatures (for example, 200°). This ensures the epitaxial layer structure of the wafer tiles 220 is not degraded. Non-metallic complementary bonding layers 290 such as silicon, polysilicon, silicon dioxide or silicon nitride may also be used.

Large gaps between semiconductor tiles 220 are desirably avoided as such gaps may adversely affect the spin-deposition of photoresist. The semiconductor tiles 220 are preferably square or rectangular in shape. Such shapes allow arrays of rectangular chips to be efficiently contained inside the semiconductor tiles 220, and also allows semiconductor tiles 220 to be cut by scribing and breaking along crystal planes, which are typically rectangular.

However, other tile shapes may also be used. Hexagonal tiles, for example, may cover the surface of a circular substrate 210 more efficiently than rectangular tiles. The preferred embodiment uses a set of non-uniform square or rectangular tiles as represented in FIG. 1. The selected pattern semiconductor tiles 220 depends on the size of the available semiconductor wafers, and the size of the metallic substrate 210.

The semiconductor tiles 220 are positioned on top of the polished surface of the metallic substrate 210, such that the semiconductor tiles 220 preferably abut each other (or are closely spaced together) to form a substantially continuous semiconductor surface. Small gaps (for example, of less than 5 $\mu$m) may be advantageous for the reasons noted above. The semiconductor tiles 220 are arranged to ensure a common crystal axis orientation. The semiconductor tiles 220 and metallic substrate 210 are then subjected to a compressive force at elevated temperature, which causes a eutectic alloy to form and permanently bond the semiconductor tiles 220 to the metallic substrate 210.

In a specific embodiment, bonding occurs by placing each of the tiles overlying the metal substrate. A bonding layer such as those described herein as well as others is also provided. Bonding occurs using mechanical force between each of the tiles and the substrate to compress the bonding layer. Heating is also provided. In a specific embodiment, heating and pressure (normal to the surface of the tiles and substrate) is applied, while maintaining each of the tiles free from lateral movement with respect to the substrate to form, for example, a eutectic bonding layer between each of the tiles and the metal substrate. Of course, there can be many variations, alternatives, and modifications.

Front-Side Processing of Composite—Step 340

The front-side of the composite wafer is now processed according to standard semiconductor fabrication techniques. Fiducial alignment marks are provided on each tile 220, to allow for slight misalignments between semiconductor tiles 220. Individual chips are preferably arranged on the semiconductor tiles 220, such that the chips are wholly contained within tiles 220 and do not span semiconductor tile boundaries.

Opening via Holes—Step 350

Unlike existing semiconductor processes, which create via holes from the back-side of a wafer toward the front-side, via holes can be made from the front side toward the metallic substrate 210. The alignment of via holes is thus simplified as this alignment is relative to other visible front-side features.

Metallizing via Holes—Step 360

The presence of the metallic substrate 210 allows large areas of the semiconductor tiles 220 to be removed in the via hole process without compromising the structural strength of the composite wafer. This means that via hole "trenches" can be formed on the semiconductor tiles 220. These trenches are able to provide the following features:

(i) relatively low inductance ground connections compared to ordinary round vias;

(ii) electromagnetic screening between adjacent circuits, which is important as circuit densities increase;

(iii) chip separation outlines; and (iv) contouring of the semiconductor wafer to achieve localized heat spreading features.

Cutting into Individual Devices—Step 370

The individual chips are separated by cutting the metallic substrate 210 either from the front-side or back-side depending on the capabilities of the process machinery.

Since each chip is supported by a portion of the metallic substrate 210, chip breakage is reduced during handling. Also, larger chips may be fabricated. As a result, more functions/systems may be integrated on a single chip. Such chips offer considerable cost savings by simplifying engineering and production requirements.

The presence of the metallic substrate 210 on each chip also serves as a heat spreader, which is advantageous in high power applications.

Further Variations

One variation of the above-described fabrication procedure is to bond un-thinned wafer tiles 220 to the metallic substrate 210. The semiconductor tiles 220 may be subsequently thinned when bonded to the metallic substrate 210. This variation provides the advantages of "planarising" the semiconductor surface of the wafer composite during the thinning process. The epitaxial device layers are, as a consequence, grown on the wafer composite.

This revised procedure may provide economic benefits in certain circumstances. Further, handling requirements of wafer tiles 220 before bonding are relaxed as the semiconductor tiles 220 are of greater thickness at this stage.

A metallic bonding layer 250 is described herein, though other techniques may be used to affix the semiconductor tiles 220 to a metallic substrate 210. For example, adhesives adapted to the temperature and chemical processing conditions involved in semiconductor fabrication may be used to adhere semiconductor tiles 220 to a metallic substrate 210.

The techniques described herein are suitable for manufacturing semiconductor devices including those using composite semiconductors large-diameter composite metallic substrates. As well as other benefits described herein, the described techniques potentially offer improved radio frequency performance, improved yield and lower costs through economies of scale.

Various alterations, modifications and substitutions can be made to the arrangements and techniques described herein, as would be apparent to one skilled in the relevant art in the light of this disclosure without departing form the scope and spirit of this invention.

What is claimed is:

1. A semiconductor wafer composite for fabricating a semiconductor device, the semiconductor wafer composite comprising;

a metallic substrate; and at least one semiconductor tile bonded to the metallic substrate, wherein connections are formed between semiconductor devices on a front-side surface of the at least one semiconductor tile and the metallic substrate by etching apertures in semiconductor material from a front-side of the at least one semiconductor tile and patterning a metal layer across the resulting front-side surface and aperture walls.

2. The semiconductor wafer composite as claimed in claim 1, wherein semiconductor material is removed from the at least one semiconductor tile to form elongated trenches arranged to form perimeters around portions of a surface of the at least one semiconductor tile.

3. A semiconductor wafer composite for fabricating a semiconductor device, the semiconductor wafer composite comprising;

a metallic substrate; and at least one semiconductor tile bonded to the metallic substrate, wherein the metallic substrate further comprises an inert coating layer that substantially covers at least part of the metallic base layer and/or the bonding layer.

4. The semiconductor wafer composite as claimed in claim 3, wherein the inert coating layer is predominantly formed of a noble metal.

5. A semiconductor wafer composite for fabricating a semiconductor device, the semiconductor wafer composite comprising;

a metallic substrate; and at least one semiconductor tile bonded to the metallic substrate, wherein the at least one semiconductor tile comprises a compound semiconductor;

wherein the at least one semiconductor tile further comprises a complementary bonding layer suitable for adhering to the metallic substrate.

6. The semiconductor wafer composite as claimed in claim 5, wherein the at least one semiconductor tile is sequentially (i) cut to a predetermined shape, (ii) thinned, and (iii) bonded to the metallic substrate.

7. The semiconductor wafer composite as claimed in claim 5, wherein the at least one semiconductor tile is sequentially (i) thinned, (ii) cut to a predetermined shape, and (iii) bonded to the metallic substrate.

8. The semiconductor wafer composite as claimed in claim 5, wherein the at least one semiconductor tile is sequentially (i) cut to a predetermined shape, (ii) bonded to the metallic substrate, and (iii) thinned.

9. The semiconductor wafer composite as claimed in claim 5, wherein the semiconductor wafer composite is diced to form individual integrated circuits having metallic substrates.

10. The semiconductor wafer composite as claimed in claim 5, wherein the complementary bonding layer is predominantly formed of one or more metals, one of which is a noble metal.

11. The semiconductor wafer composite as claimed in claim 5, wherein the metallic substrate and the at least one semiconductor tile have respective coefficients of thermal expansion that are substantially similar values.

12. The semiconductor wafer composite as claimed in claim in 5, wherein the at least one semiconductor tile has a substantially rectangular or square shape.

13. A semiconductor wafer composite for fabricating a semiconductor device, the semiconductor wafer composite comprising:
   a metallic substrate; and
   at least one semiconductor tile bonded to the metallic substrate,
   wherein the process further comprises:
   forming connections between semiconductor devices on a front-side surface of the at least one semiconductor tile and the metallic substrate by etching apertures in semiconductor material from a front-side of the at least one semiconductor tile; and
   patterning a metal layer across the resulting front-side surface and aperture walls.

14. The semiconductor wafer composite as claimed in claim 13, wherein the process further comprises removing semiconductor material from the at least one semiconductor tile to form elongated trenches arranged to form perimeters around portions of the surface of the at least one semiconductor tile.

15. A semiconductor wafer composite for fabricating a semiconductor device, the semiconductor wafer composite comprising:
   a metallic substrate; and
   at least one semiconductor tile bonded to the metallic substrate,
   wherein the process further comprises substantially covering at least part of the metallic base layer and/or the bonding layer with an inert coating layer.

16. The semiconductor wafer composite as claimed in claim 15, wherein the process further comprises forming the at least one semiconductor tile with a working layer predominantly of a compound semiconductor.

17. The semiconductor wafer composite as claimed in claim 15, wherein the process further comprises forming the at least one semiconductor tile with a complementary bonding layer suitable for adhering the at least one semiconductor tile to the metallic substrate.

18. The semiconductor wafer composite as claimed in claim 17, wherein the process further comprises forming the complementary bonding layer predominantly of one or more metals, one of which is a noble metal.

19. The semiconductor wafer composite as claimed in claim 15, wherein the process further comprises forming the bonding layer predominantly of two or more metals that form a eutectic alloy when heated.

20. The semiconductor wafer composite as claimed in claim 15, wherein the process further comprises forming the inert coating layer predominantly of a noble metal.

21. The semiconductor wafer composite as claimed in claim 15, wherein the process further comprises matching respective coefficients of thermal expansion of the at least one semiconductor tile and the metallic substrate to substantially similar values.

22. The semiconductor wafer composite as claimed in claim 15, wherein the process further comprises cutting a semiconductor wafer to a substantially rectangular or square shape to form the at least one semiconductor tile.

23. A semiconductor wafer composite suitable for fabricating a semiconductor device, the semiconductor wafer composite comprising:
   a metallic substrate comprising (i) a base metallic layer, (ii) a metallic bonding layer predominantly formed of two or metals that form a eutectic alloy when heated, and (iii) an inert coating layer predominantly formed of a noble metal; and
   multiple semiconductor tiles bonded to the metallic substrate by heating the semiconductor tiles and the metallic substrate when the semiconductor tiles and the metallic substrate are in physical contact, so that the semiconductor tiles bond to the metallic bonding layer via the inert coating layer.

* * * * *